(12) United States Patent
Litwin (10) Patent No.: US 6,507,047 B2
(45) Date of Patent: Jan. 14, 2003

(54) POWER TRANSISTORS FOR RADIO FREQUENCIES

(75) Inventor: Andrej Litwin, Danderyd (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/858,902

(22) Filed: May 17, 2001

(65) Prior Publication Data

US 2002/0014670 A1 Feb. 7, 2002

(30) Foreign Application Priority Data

May 17, 2000 (SE) .............................................. 0001815

(51) Int. Cl.[7] ........................................ H01L 31/0312
(52) U.S. Cl. ......................... 257/77; 257/343; 257/728
(58) Field of Search .......................... 257/77, 341, 343, 257/401, 728; 438/176, 167

(56) References Cited

U.S. PATENT DOCUMENTS

| | | | | |
|---|---|---|---|---|
| 5,264,713 A | * | 11/1993 | Palmour | 257/267 |
| 5,294,814 A | * | 3/1994 | Das | 257/263 |
| 5,319,237 A | | 6/1994 | Legros | |
| 5,719,433 A | | 2/1998 | Delage et al. | |
| 5,726,463 A | * | 3/1998 | Brown et al. | 257/288 |
| 5,998,240 A | | 12/1999 | Hamilton et al. | |

FOREIGN PATENT DOCUMENTS

| | | |
|---|---|---|
| EP | 0 405 877 A2 | 1/1991 |
| EP | 0 518 683 A1 | 12/1992 |
| WO | 96/08844 A1 | 3/1996 |

* cited by examiner

Primary Examiner—George C. Eckert, II
(74) Attorney, Agent, or Firm—Nixon & Vanderhye, P.C.

(57) ABSTRACT

A field effect transistor is made on a chip comprising a SiC-substrate. The transistor includes a plurality of densely stacked parallel transistor cells occupying totally a rectangular area. Each transistor cell has parallel strip-shaped regions forming the electrodes and active areas of the cell and each inner cell shares its drain and sources electrodes with neighbouring cells. In order to give a good power dissipation allowing an electrical high power of the transistor, the rectangular area has a very elongated shape and specifically it should have a width not larger than substantially 50 μm. In the rectangular area all the transistor cells have their strip-shaped regions located in parallel to short sides of the rectangular area and are generally very short considering the length of the rectangular area. Thus specifically also each cell has a length not larger than substantially 50 μm. The distances from the long sides of the rectangular area to the edges of the chip should be at least 50% and preferably 60% of the thickness of the chip to allow a good thermal flow out of the active rectangular area. A plurality of such very elongated active areas can be located on a single chip.

9 Claims, 9 Drawing Sheets

POWER TRANSISTORS FOR RADIO FREQUENCIES

The present invention relates to power transistors for radio frequencies, in particular transistors based on SiC and the thermal design thereof.

BACKGROUND

In the output stages of radio frequency transmitters of communication systems power amplifiers are used. In the power amplifiers various active devices are used. For low output levels devices based on semiconductors are used and for high power output, such as above 1 kW, vacuum tubes or other special amplification means are used. Thus, travelling wave tubes (TWTs), klystrons, can be used for power levels up to 10 MW.

The semiconductor devices include basically different types of transistors. Transistors suitable for high frequencies were first fabricated based on germanium but were then replaced by bipolar transistors based on silicon which have since been the dominating devices used for power amplification at radio frequencies. In mobile telecommunication systems bipolar silicon-based transistors are presently used in the output amplifiers of base stations and they have a good performance up to at least 2 GHz. Thus they have a good stability, are easily available/fabricated and have a relatively low cost.

Other semiconductor devices also used for RF power amplification include MESFETs based on GaAs and the recently developed laterally diffused MOS-transistors (LD-MOSes). Generally, there is still a great need for improved or new devices to be used in power amplifiers because of the expanding use of telecommunications, also for high frequencies.

Power transistors are especially designed to deliver a high output power and to have a high gain. The manufacturing processes, device parameters, layouts and packages have been carefully studied and tuned to achieve this. The transistors have to fulfil a multitude of requirements as to breakdown voltage, DC gain or transconductance, capacitance values, RF gain, ruggedness, noise figure, input/output impedance, distortion, etc. The frequencies for which the transistors are designed range from several hundred MHz up to and into the microwave region. When designing transistors for increasing output power, from the output power level of 1 W special considerations have to made and this power level may be taken as a rough lower limit of the output power provided by a transistor which can be called a power transistor. Transistors for lower output power can be called "normal transistors" and are used for example for small signal processing, pulse switching, etc., the output power levels being lower than about 1 W. For power applications, usually only one transistor of n-channel type built on single die or chip is used. However, when the power required is very high, such as up to hundreds of watts or even up to kilowatts, this power is achieved by arranging a plurality of parallel transistor cells on a single die or even using a multitude of separate dies comprises in a single package. Packages containing such power components often have large gold-plated heat sinks to conduct the heat generated by the components.

Transistors based on silicon carbide (SiC) have recently been studies as a possible alternative of transistors based both on Si and GaAs for power applications at GHz frequencies. The unique properties of SiC include a high electric break-down field of e.g. about $4 \cdot 10^6$ V/cm, a high saturated electron drift velocity of e.g. about $2 \cdot 10^7$ cm/s and a high thermal conductivity of e.g. about 4.9 W/cm·K. Therefore, devices based on SiC have been predicted to be capable of handling much higher power densities compared to those handled by the other mentioned transistor types, and they can also operate at much higher temperatures owing to the superior properties of the SiC-material. This has been experimentally demonstrated. SiC devices preferably are operated at very high supply voltages of 48 V or more in order to fully exploit the advantages of the devices.

One of the problems associated with currently used semiconductor transistors manufactured based on Si or GaAs is the limited temperature at which the performance of such transistors starts to degrade. Normally, Si-transistors are not operated above 150° C. temperature of the active junction. This temperature sets the limit on the possible temperature of the heat sink and on the ambient temperature, which for a radio base station (RBS) normally is limited to 70° C. and 60° C., respectively. However, it would be very advantageous to allow an increase of both the ambient temperature and the temperature of the heat sink to eliminate external cooling such as by air conditioning. Then, it could be possible to mount power amplifiers directly on the antennas of such a station where the temperature in some cases in hot climates can exceed the above mentioned temperatures. Transistors based on SiC can operate at higher temperatures than transistors based on Si, and the heat conductivity of SiC is three times that of Si, which allows heat to be conducted away from Sic-devices much more efficiently. Thus, SiC-based amplifiers are well-suited to be mounted at places where the ambient temperatures are high. However, there is one particular problem associated with SiC-devices. In order to achieve a high performance, SiC-devices must operate at power densities which are several times, e.g., about 3–20, higher than devices based on Si. Since power amplifiers used for radio frequencies are normally operated as Class A or Class AB amplifiers, 40–60% of the total input power is dissipated in the SiC-transistor itself. Thus SiC-transistors will dissipate much more power per unit area than Si-transistors. This high power heats the SiC-transistors and to high temperatures and degrades its electrical characteristics. Also, the heat conduction depends on temperature and decreases with increasing temperature. Hence, the much higher power dissipation density will offset the improved power handling capability of SiC-transistors provided that no particular measures are made to make the heat transport from the devices more efficient.

Field effect transistors for high power applications are e.g. described in the published European patent application No. 0 518 683.

SUMMARY

It is an object of the present invention to provide a transistor based on SiC with a high output power which still has a moderate temperature.

The problem, which the invention solves, is how to construct a transistor based on SiC that operates at high output power and does not require special cooling measures.

A field effect transistor, such as a MESFET, is made on a chip comprising a SiC-substrate. The transistor includes a plurality of densely stacked parallel transistor cells occupying a rectangular active area. Each transistor cells has parallel strip-shaped regions forming the electrodes and active areas of the cell, and each inner cell shares its drain and sources electrodes with neighboring cells. The active area has a very elongated shape, and specifically, it should have a width not larger than substantially 50 μm, in order to give a good power dissipation allowing an electrical high power in the operation of the transistor. In the active area, all the transistor cells have their strip-shaped regions located in parallel to the short sides of the rectangular area, the cells thus being relatively very short considering the length of the active area. Each cell has a length not larger than substantially 50 μm. The distances from the long sides of the rectangular area to the edges of the chip should be at least 50% and preferably 60% of the thickness of the chip to allow a good thermal flow out of the active rectangular area.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention both as to organization and content, and of the above and other features thereof may be gained from and the invention will be better appreciated from a consideration of the following detailed description of non-limiting embodiments presented hereinbelow with reference to the accompanying drawings, in which:

DETAILED DESCRIPTION

Figure 1:
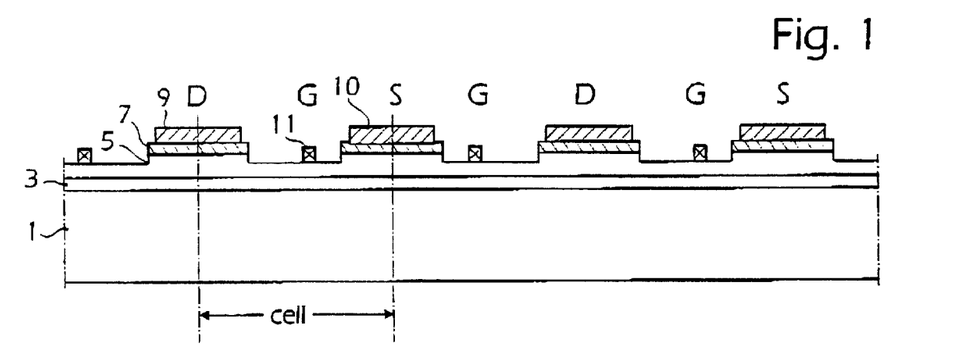
FIG. 1 is a cross-sectional view of cells of parallel planar MESFETs built on SiC.

In FIG. 1 a cross-section of an exemplary embodiment of a planar MESFET having several transistor cells and based on SiC is shown, only the undermost layers of the transistors been drawn in the figure. On a semi-insulating or conductive substrate 1 of SiC a buffer layer 3 has been epitaxially grown. Thereupon another epitaxial SiC-layer 5 has been grown having a contacting layer 7 on the top thereof. The contact layer 7 is heavily doped and has also been grown by epitaxy. In the active layer 5 the channels of the parallel FETs will exist/be produced. The contacting layer 7 is etched to form recesses down into the epitaxial layer 5 to form mesas which constitute the drain and source electrodes. On top of the remaining regions of the contacting layer and in the recesses metal areas 9, 10, 11 are formed by sputtering or some depositing process such as CVD. The metal areas 9, 10 located on top of the remaining regions of the contacting layer 7 are the electrical contacts of the drain and source respectively and the metal areas 11 in the recesses are the gate electrodes.

Figure 2:
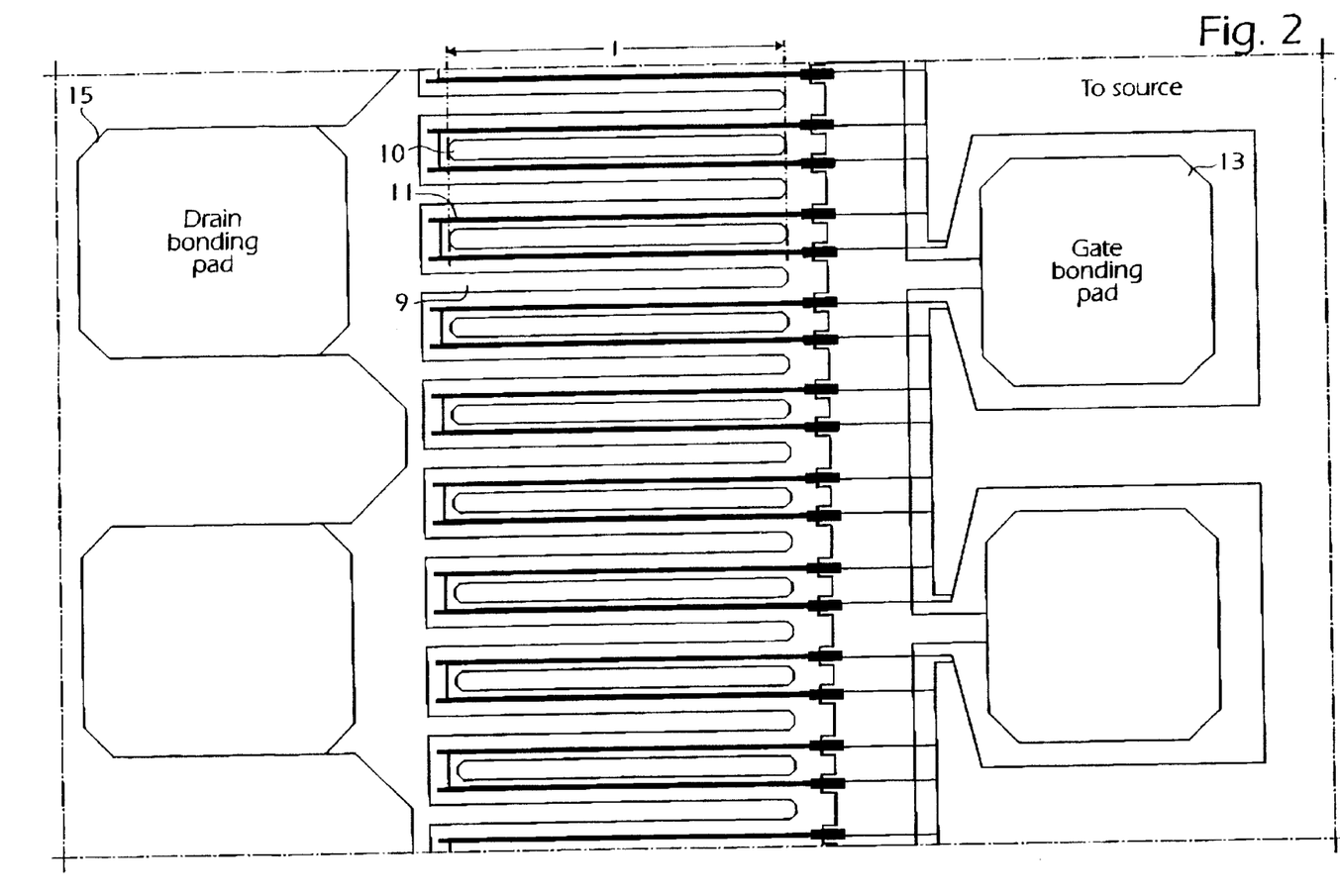
FIG. 2 is a schematic plan view showing the layout of a plurality of transistor cells in a power transistor.

The layout of such a MESFET, as seen from above, could be as shown in FIG. 2, the drain, source and gate electrode 9, 10, 11 forming elongated areas or strips located at each other. For a transistor comprising a single transistor cell, see the region between the dashed and dotted lines in FIG. 1, the length 1 of strip-shaped areas, see FIG. 2, is restricted to the feasible length of a chip and also high frequency properties can limit the length owing to contacting problems. Such a transistor cell can provide a maximum output power as determined by the electric power developed by the cell and the temperature characteristics of the cell and the mounting and cooling of the chip. In those cases where a higher output power is required, it is common to make the transistor as a plurality of parallel transistor cells as seen in FIGS. 1 and 2, each transistor cell comprising a complete transistor and having strip-shaped electrodes which all extend in parallel to each other. This gives a finger structure as illustrated in FIG. 2, this figure showing a portion of a chip carrying a power MESFET, compare the rectangular area 12 in FIG. 3. It is seen in FIGS. 1 and 2 that for each transistor cell, except those at the end of the row of parallel cells, the source electrode 10 is common to the cell and the adjacent cell located on one side of the considered cell and the drain electrode is common to the considered cell and the adjacent cell located on the opposite side of the considered cell. In order to use the area of the chip as efficiently as possible and reduce the parasitic capacitances of the electrode areas the widths of the shared source and drain electrode areas are made as small as possible considering that the resistance of the electrode areas in the longitudinal direction thereof should not be too high and the available lithographic technology.

The same structure of parallel cells having common or shared electrode areas as depicted in FIGS. 1 and 2 is conventionally used for transistors of other types such as IGFETs or bipolar transistors in the case where they are to provide large output power.

In FIG. 2 only the layout of two metal layers is shown, Metal1 and Metal2. Bonding pads 13 for the gates are located in a row along a side of the row of cells, at ends of the cells, and bonding pads 15 for the drain electrodes are located in a row along the opposite side, at the opposite ends of the cells. For the sources the bonding pads are not shown, but they are connected by e.g. the top metal layer Metal2 in areas around the gate bonding pads 13.

When using a densely stacked parallel transistor structure such as that depicted in FIG. 2, power is dissipated in each of the transistor cells. The dissipated power then heats the respective cells and the area around it. Hence, the transistor cells will heat each other. Some examples of possible transistor designs having the same dense parallel stacking of transistor cells have been simulated considering the complete thermal flow from the die, through the package enclosing the die to an external heat sink. In the examples studied, the lengths of the transistor cells and the areas which the cell occupy have been varied whereas all the cells had the same widths, the total die area was maintained constant and equal to 1 mm$^2$, the die thickness was assumed to be 0.15 mm and the totally dissipated power was equal to P=15 W. The results of the thermal simulations are discussed hereinafter.

Figure 4A:
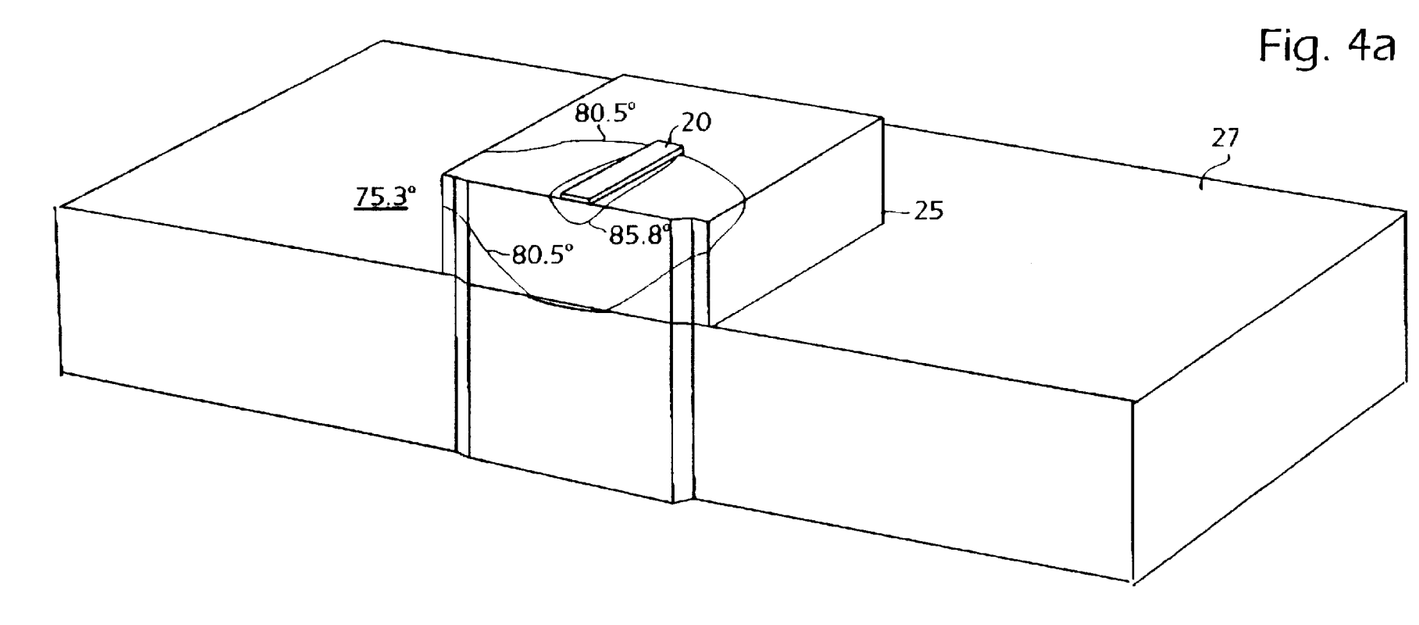
FIGS. 4a, 4b are perspective views of the transistor of FIG. 3 as mounted on a package flange and a heat sink, in which figures the temperature distribution is shown.
Figure 4B:
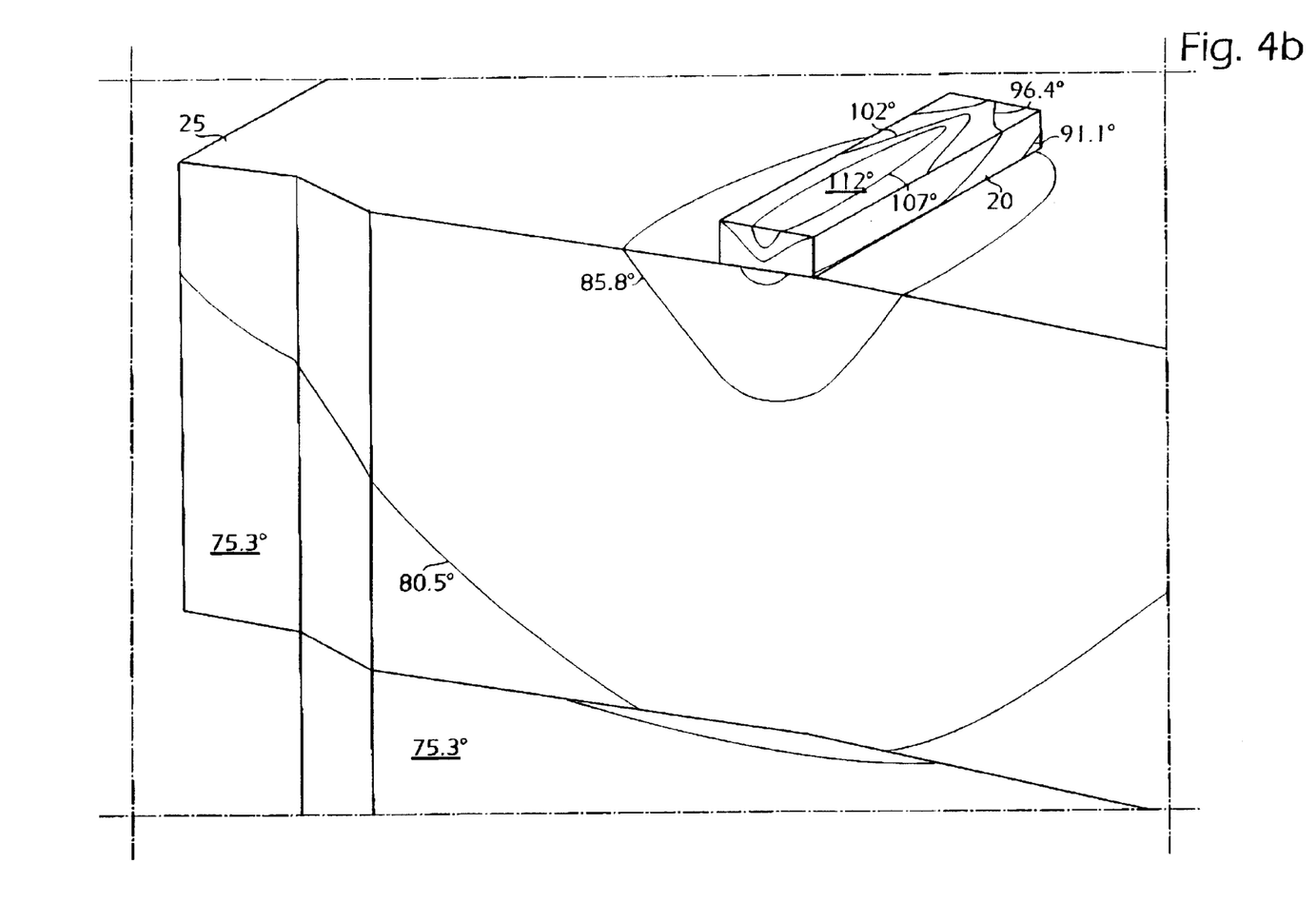
Figure 5:
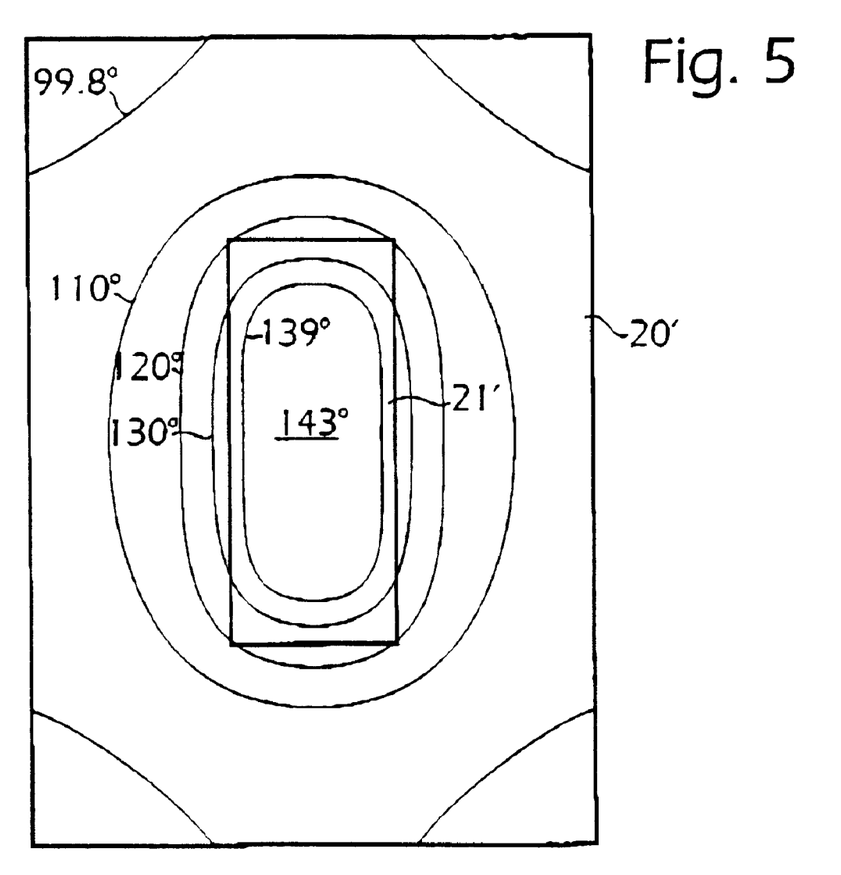
FIG. 5 is a plan view of a power transistor having long fingers in which the temperature distribution is shown.
Figure 6A:
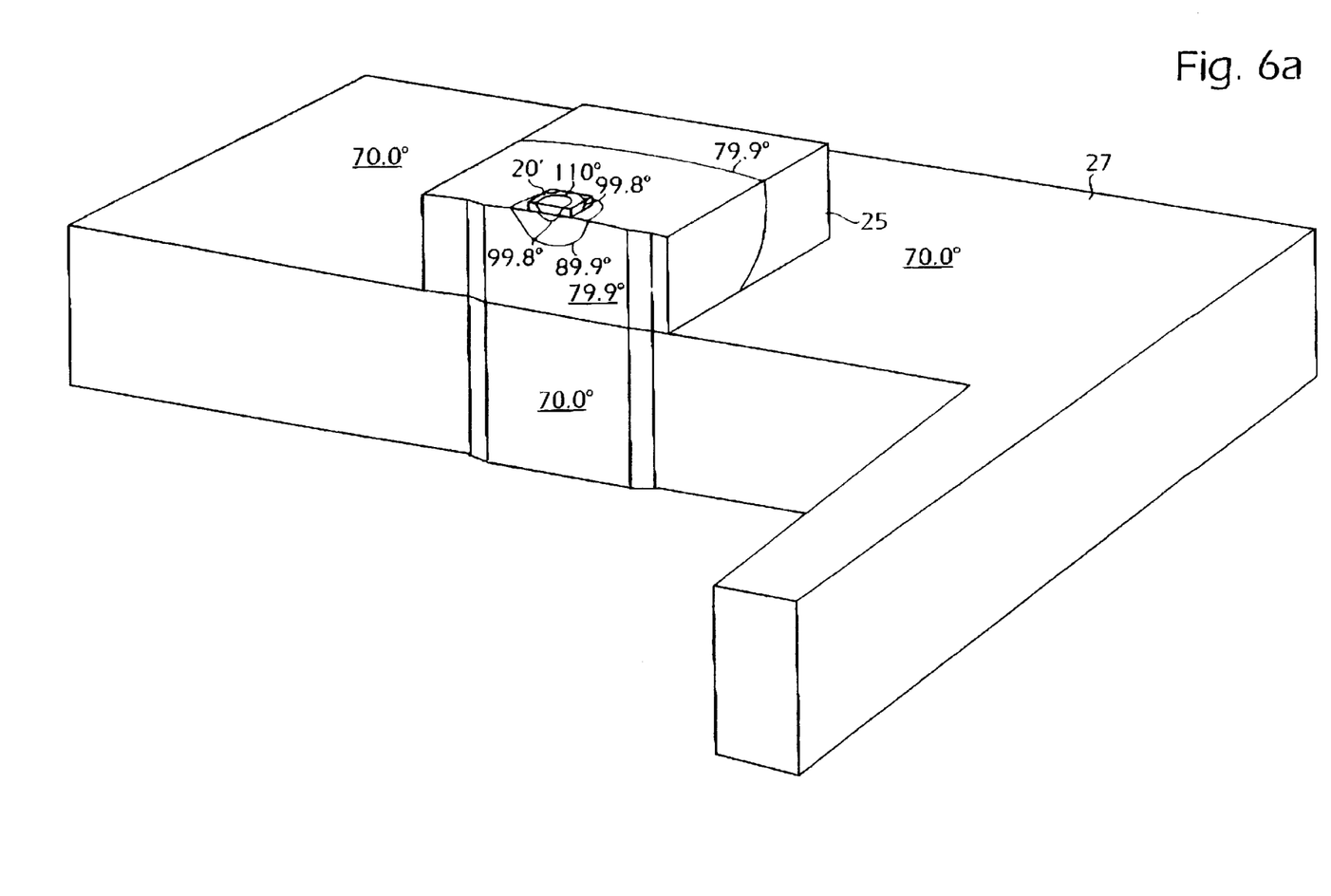
FIGS. 6a, 6b are perspective views of the transistor of FIG. 5 as mounted on a package flange and a heat sink, in which figures the temperature distribution is shown.
Figure 6B:
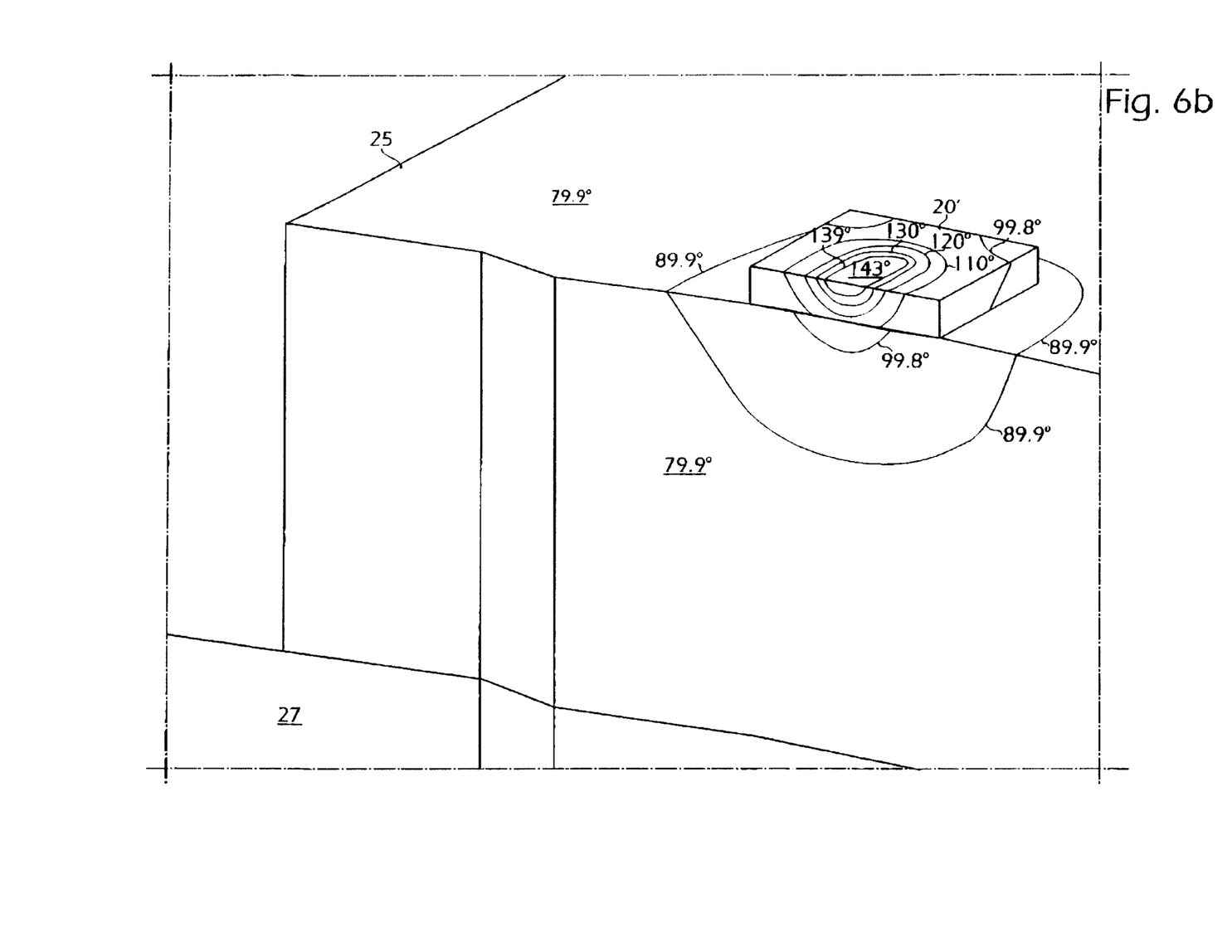

Transistors having longer fingers were also thermally simulated. The source of heat generated in the transistors was as above assumed to be evenly distributed over the active transistor area 21' which in this case was somewhat larger and equal to 0.15 mm$^2$ (the same output power of 15 W was assumed. A standard package was assumed and a cooling flange 25 made of Cu and a heat sink 27 of Al as above, see FIGS. 4a, 4b. The assumed chip 20' is shown in FIG. 5 and it has the dimensions of 1.2×0.85 mm². In the middle of the chip 20' a rectangular active region 21' of the area 0.15 mm² is drawn. The active region 21' includes a plurality of stacked parallel transistor cells which as above are parallel to the short sides of the chip. The transistor cells all have a length of 250 μm and the length of the active region is 0.6 mm. The temperature distribution is seen in FIGS. 6a–6b, the highest temperatures of 139–143° C. being found in the center of the chip 20', in a region at and around the transistor cell area 21'.

Transistors having longer fingers were also thermally simulated. The source of heat generated in the transistors was as above assumed to be evenly distributed over the active transistor area 21' which in this case was somewhat larger and equal to 0.15 mm² (the same output power of 15 W was assumed). A standard package was assumed and a cooling flange 25 made of Cu and a heat sink 27 of Al as above, see FIGS. 7a, 7b. The assumed chip 20' is shown in FIG. 5 and it has the dimensions of 1.2×0.85 mm². In the middle of the chip 20' a rectangular active region 21' of the area 0.15 mm² is drawn. The active region 21' includes a plurality of stacked parallel transistor cells which as above all are parallel to the short sides of the chip. The transistor cells all have a length of 250 μm and the length of the active region is 0.6 mm. The temperature distribution is seen in FIGS. 6a–6b, the highest temperature of 139–143° C. being found in the center of the chip 20', in a region at and around the transistor cell area 21'.

It appears from the simulations that a SiC-transistor having long fingers had a temperature of its die which was almost 40° C. higher than a similar transistor having shorter fingers of a length corresponding to one fifth of the length of the long fingers, in spite of its 40% larger area of the transistor cells what means a power density which actually was 30% lower than that of SiC-transistor having short fingers. Thus, the thermal resistance of the SiC-transistor is almost doubled due to a poorly optimized layout. A chip having a large number of short parallel transistor cells will be strip-shaped like the chip 20 of FIG. 3, all the cells having longitudinal directions perpendicular to the long sides of the chip and to the longitudinal direction of the chip. The good thermal properties of SiC-transistors having short fingers results from the fact that a substantial amount of heat is conducted at the sides of the active cell area 21 and this surrounding area increases with the total width of the parallel transistor cells.

Figure 3:
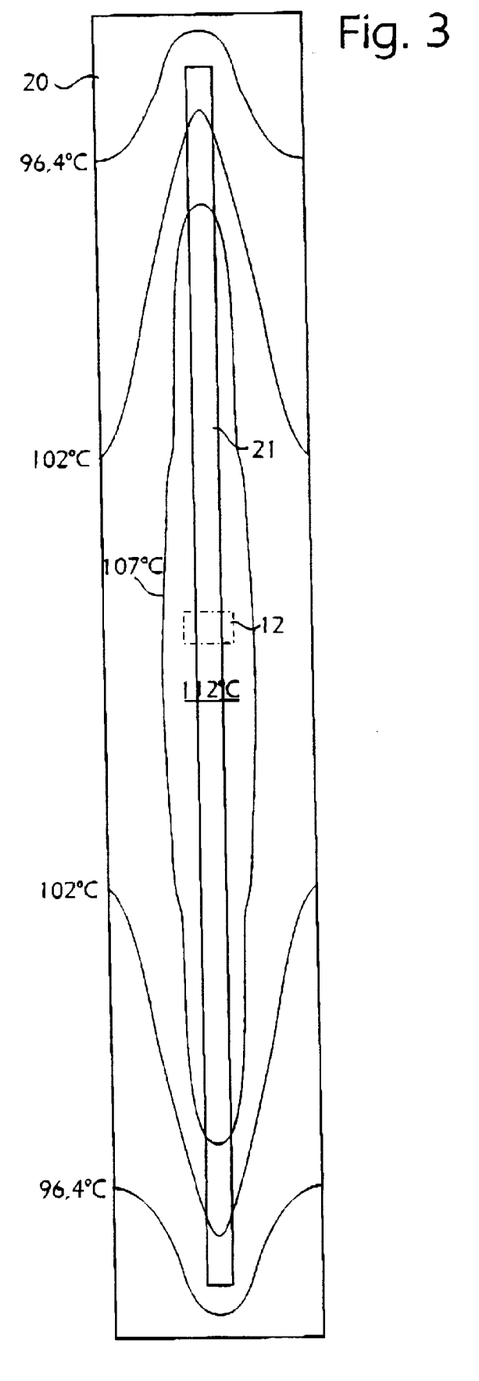
FIG. 3 is a plan schematic view of a power transistor having short fingers in which the temperature distribution is shown.

Generally, the layout of a chip 20 as indicated in FIG. 3 would instead allow, for the same outline of the active area 21, a few parallel transistor cells having long parallel fingers which are also parallel to the longitudinal direction of the elongated chip. However, very long transistor cells are not desired since the high frequency characteristics of such transistors may be poor owing to series resistances and inductances of the elongated electrode interconnects.

From the simulations it has been found that in order to keep the maximum surface temperature at a minimum in a transistor design comprising a multitude of parallel densely stacked transistor cells the length of the fingers of the cells should not exceed 50 μm. Also, in order to secure an efficient transport of heat in the area of the chip surrounding the transistor cells, the distance between the edges of the cells and at least the long edges and preferably all the edges of the chip should be at least 50% and preferably 60% of the thickness of the chip.

A transistor chip having suitable dimensions for short fingers will be rather long and narrow. It can be difficult to handle such a chip after manufacturing it, i.e. after splitting the semiconductor wafer used in the processing steps into different chips. Then a second row of parallel transistor cells can be located on the same chip, see FIG. 7, the second row being parallel to the first one. Thus, in FIG. 7 each row 21" has half the number of cells found in the active area of the chip design of FIG. 3 and thus half the length. Each row is placed in a rectangular area 23 of the chip 20". The width of the zones of each such rectangular area 23 not carrying the active region 21" corresponds to those of the chip of FIG. 3. The distances from the edges of each row 21" in FIG. 3 to the edges of the respective rectangular area are thus the same as the distances from the edges of the active area 21 in FIG. 3 to the edges of the chip 20. Thus, the total cell area or active area is still 0.11 mm² but the total chip area is somewhat increased, to 1.08 mm². Since each rectangular area should be designed as the chip 3, the distance between the parallel rows of cells has to be at least 100% and preferably at least 120% of the thickness of the chip whereas the distances between the edges of the cell areas at least the edges of the chip parallel to the parallel rows and orthogonal to the transistor fingers should as above be at least 50% and preferably at least 60% of the thickness of the chip.

Figure 7:
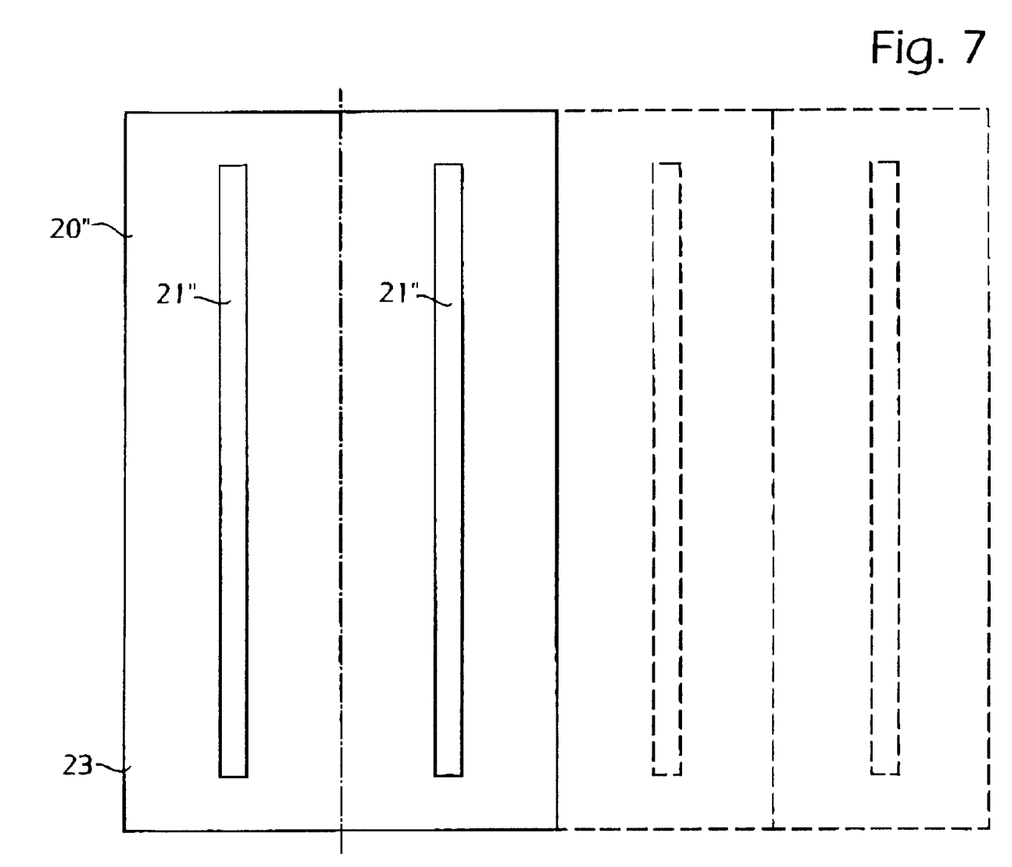
FIG. 7 is a plan view of a power transistor having short fingers arranged in two parallel rows.

Even more parallel rows of parallel transistor cells on a single chip can be used as is indicated by the dashed lines in FIG. 7. In the design of such a chip the above mentioned minimum distances between the rows of cells and the edges of the rectangular area associated with the respective cell should be maintained.

The layout of transistors as described above is not restricted to only SiC-transistors having substrate and device layers of SiC, but also transistors having other semiconductor materials such GaN, AlN and $Ga_xAk_{1-x}N$ used in layers deposited on top of a SiC-substrate area advantageously manufactured using the same layout.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. A transistor on a SiC-substrate in a chip, comprising:
   a plurality of densely-stacked transistor cells arranged in parallel, each transistor cell comprising parallel, strip-shaped regions forming electrodes and active areas of the transistor cell, and each transistor cell having neighboring transistor cells sharing drain and source electrodes with the neighboring transistor cells, the transistor cells occupying a rectangular area on the SiC-substrate.
   wherein the rectangular area is elongated having a width not larger than substantially 50 μm.

2. The transistor of claim 1, wherein in said rectangular area, the transistor cells have their strip-shaped regions located in parallel to short sides of the rectangular area, so that the strip-shaped regions will have a length not larger than substantially 50 μm.

3. The transistor of claim 1, wherein the distances from the long sides of the rectangular area to edges of the chip area at least 50% of the thickness of chip.

4. The transistor of claim 1, wherein the distances from the long sides of the rectangular area to edges of the chip are least 60% of the thickness of the chip.

5. The transistor of claim 1, wherein a plurality of separate rectangular areas are arranged, the rectangular areas having long sides parallel to each other and being placed at a uniform distance of each other, the rectangular areas separated by areas having a width corresponding to at least twice the shortest distances from the long sides of the rectangular areas to edges of the chip.

6. The transition of claim 1, wherein an operating frequency of the transistor is in the range of several hundred MHz up to and into the microwave region.

7. The transistor of claim 1, wherein an operating frequency of the transistor is in the range of several hundred MHz up to 45 GHz.

8. The transistor of claim 1, wherein the width of the rectangular area is independent of an operating frequency of the transistor.

9. The transistor of claim 1, wherein the width of the rectangular area at 50 $\mu$m or less is set to substantially reduce or minimize a surface temperature of the transistor under operating conditions.

* * * * *